United States Patent
Tan et al.

(10) Patent No.: US 12,222,461 B2
(45) Date of Patent: Feb. 11, 2025

(54) ANTENNA CALIBRATION IN AN EM LOGGING TOOL

(71) Applicant: Schlumberger Technology Corporation, Sugar Land, TX (US)

(72) Inventors: Kong Hauw Sarwa Bakti Tan, Sugar Land, TX (US); Qingyan He, Pearland, TX (US); Qing Zhang, Sugar Land, TX (US); Desheng Zhang, Sugar Land, TX (US); Kent Harms, Richmond, TX (US); Daniel Fernandez, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 209 days.

(21) Appl. No.: 17/999,067

(22) PCT Filed: Jun. 21, 2021

(86) PCT No.: PCT/US2021/038233
§ 371 (c)(1),
(2) Date: Nov. 17, 2022

(87) PCT Pub. No.: WO2021/258047
PCT Pub. Date: Dec. 13, 2021

(65) Prior Publication Data
US 2023/0184991 A1    Jun. 15, 2023

Related U.S. Application Data

(60) Provisional application No. 62/705,271, filed on Jun. 19, 2020.

(51) Int. Cl.
*G01V 13/00* (2006.01)
*G01V 3/28* (2006.01)
*H01Q 1/04* (2006.01)

(52) U.S. Cl.
CPC ............... *G01V 13/00* (2013.01); *G01V 3/28* (2013.01); *H01Q 1/04* (2013.01)

(58) Field of Classification Search
CPC ............. G01V 13/00; G01V 3/28; H01Q 1/04
See application file for complete search history.

(56) References Cited

U.S. PATENT DOCUMENTS

| 5,293,128 A | 3/1994 | Zhou |
| 7,319,331 B2 | 1/2008 | Pelegri et al. |

(Continued)

FOREIGN PATENT DOCUMENTS

| EP | 1810058 B1 | 12/2019 |
| WO | 2017074346 A1 | 5/2017 |

OTHER PUBLICATIONS

International Preliminary Report on Patentability issued in International Patent application PCT/US2021/038233 on Dec. 29, 2022, 7 pages.

(Continued)

*Primary Examiner* — Feba Pothen
(74) *Attorney, Agent, or Firm* — Jeffrey D. Frantz

(57) ABSTRACT

A method for calibrating an electromagnetic measurement tool includes deploying a test loop about a first antenna in the electromagnetic measurement tool and electromagnetically coupling the test loop and the first antenna and measuring a first voltage. The test loop is then deploying about a second antenna in the electromagnetic measurement tool and electromagnetic ally coupling the test loop and the second antenna and measuring a second voltage. A ratio of the first voltage to the second voltages is computed that can be used to calibrate the first antenna with respect to the second antenna.

19 Claims, 6 Drawing Sheets

(56) References Cited

U.S. PATENT DOCUMENTS

| | | | |
|---|---|---|---|
| 7,414,391 | B2 | 8/2008 | Homan et al. |
| 7,915,895 | B2 | 3/2011 | Chemali et al. |
| 8,305,082 | B2 | 11/2012 | Merchant et al. |
| 10,359,539 | B2 * | 7/2019 | San Martin ............... G01V 3/38 |
| 11,061,162 | B2 * | 7/2021 | Griffing ................... G01V 3/30 |
| 2004/0113609 | A1 | 6/2004 | Homan |
| 2008/0054906 | A1 | 3/2008 | Pelegri et al. |
| 2011/0238312 | A1 | 2/2011 | Seydoux et al. |
| 2011/0074427 | A1 | 3/2011 | Wang et al. |
| 2011/0234230 | A1 | 9/2011 | Bittar et al. |
| 2012/0078558 | A1 | 3/2012 | Pelegri et al. |
| 2014/0156211 | A1 | 6/2014 | Kilic |
| 2016/0170068 | A1 | 6/2016 | Donderici |
| 2018/0347280 | A1 | 12/2018 | Zhong et al. |
| 2019/0137645 | A1 | 5/2019 | Ellis et al. |
| 2019/0137646 | A1 | 5/2019 | Frey |

OTHER PUBLICATIONS

Substantive Exam issued in Saudi Arabia Patent Application No. 522441783 dated Jun. 22, 2023, 13 pages.
International Search Report and Written Opinion issued in International Patent application PCT/US2021/038233 on Sep. 29, 2021, 9 pages.
Extended Search Report issued in European Patent Application No. 21826877.9 dated Jun. 17, 2024, 8 pages.

* cited by examiner

ANTENNA CALIBRATION IN AN EM LOGGING TOOL

CROSS REFERENCE TO RELATED APPLICATION(S)

This application is the National Stage Entry of International Application No. PCT/US2021/038233, filed Jun. 21, 2021, which claims the benefit of and priority to U.S. Provisional Application No. 62/705,271 entitled Antenna Calibration, filed Jun. 19, 2020, the entirety of which is incorporated herein by reference.

BACKGROUND

Early logging tools were run into a wellbore on a wireline cable, after the wellbore had been drilled. Modern versions of such wireline tools are still used extensively. However, the need for information while drilling the borehole gave rise to measurement-while-drilling (MWD) tools and logging-while-drilling (LWD) tools. MWD tools commonly provide drilling parameter information such as weight on the bit, torque, temperature, pressure, direction, and inclination. LWD tools commonly provide formation evaluation measurements such as resistivity, porosity, and NMR distributions. MWD and LWD tools often have components common to wireline tools (e.g., transmitting and receiving antennas), but MWD and LWD tools must be constructed to not only endure but to operate in the harsh environment of drilling.

Electromagnetic (EM) logging measurements are commonly made during drilling operations. Such techniques may be utilized to determine a subterranean formation resistivity, which, along with formation porosity measurements, may be used to indicate the presence of hydrocarbons in the formation. Moreover, azimuthally sensitive directional resistivity measurements are commonly employed e.g., in pay-zone steering applications, to provide information upon which steering decisions may be made.

Electromagnetic logging tools are commonly calibrated to account for imperfections in tool construction and gain variations due to tool electronics. The intent of the calibration is to eliminate and/or compensate for the effects of these factors on the measurement data. For example, air calibration methods are commonly employed in which an electromagnetic resistivity tool is suspended in the air (e.g. via crane) away from any conducting media. A resistivity measurement should yield near-infinite resistivity with any deviation being subtracted and assumed to be related to systematic measurement errors (e.g., related to the electronics, hardware, or processing methods). Mathematical models of the logging tool configuration are also sometimes employed in calibration procedures.

SUMMARY

A method for calibrating an electromagnetic measurement tool is disclosed. The method includes deploying a test loop about a first antenna in the electromagnetic measurement tool and electromagnetically coupling the test loop and the first antenna. A first voltage is measured in the first antenna or in the test loop while coupling. The test loop is then deploying about a second antenna in the electromagnetic measurement tool and electromagnetically coupling the test loop and the second antenna. A second voltage is measured in the second antenna or in the test loop while coupling. A ratio of the first voltage to the second voltages is computed. The ratio may be used to calibrate the first antenna with respect to the second antenna.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

For a more complete understanding of the disclosed subject matter, and advantages thereof, reference is now made to the following descriptions taken in conjunction with the accompanying drawings, in which.

DETAILED DESCRIPTION

Disclosed embodiments relate generally to downhole electromagnetic measurement methods and downhole electromagnetic measurement tools (e.g., resistivity logging while drilling tools) used in making electromagnetic measurements of a subterranean formation. When making downhole electromagnetic measurements, understanding the magnetic moment mismatch among multiple antennas in the electromagnetic tools (e.g., resistivity tools) may aid in determining a measurement. For example, in some applications, such as deep (or extra-deep) boundary detection, and/or 2D/3D reservoir imagining, only relatively small measurement errors may be acceptable. Traditional calibrations are not practical in some tools where there is a very large volume of investigation and the transmitter receiver systems are spaced apart. While some calibration procedures are in commercial use, the inventors identified a need for improved electromagnetic logging tool calibration methods.

In some embodiments, the inventors disclose herein a method having improved accuracy that does not require complex mathematical or empirical models of the logging tool. In some embodiments, a test loop and data acquisition system may be provided to calibrate measurement tool antennas. For example, in embodiments including multiple receiver antennas, the receiver antennas may be calibrated with respect to one another using a test loop and data acquisition system.

Disclosed methods include deploying the test loop about a first antenna in the electromagnetic measurement tool and inductively coupling the test loop and the antenna. A first induced voltage is measured in the first antenna or in the test loop while coupling. The test loop is then deploying about a second antenna. The test loop and second antenna are inductively coupled and a second induced voltage is measured in the second antenna or the test loop while coupling. A ratio of the first voltage to the second voltage is computed. The ratio may be used to calibrate the first antenna with respect to the second antenna.

The ratio may be programmed into the measurement tool and used to correct for magnetic moment mismatch between the first and second antenna (i.e., to calibrate the first antenna with respect to the second antenna or vice versa). The disclosed embodiments may advantageously provide for improved measurement accuracy by calibrating one antenna with respect to another (e.g., with respect to an adjacent antenna of similar construction). Moreover, the calibration may be advantageously performed without the use of an electromagnetic coupling model, without calibration between receiver subs, and without calibration between the transmitter and receiver subs.

Figure 1:
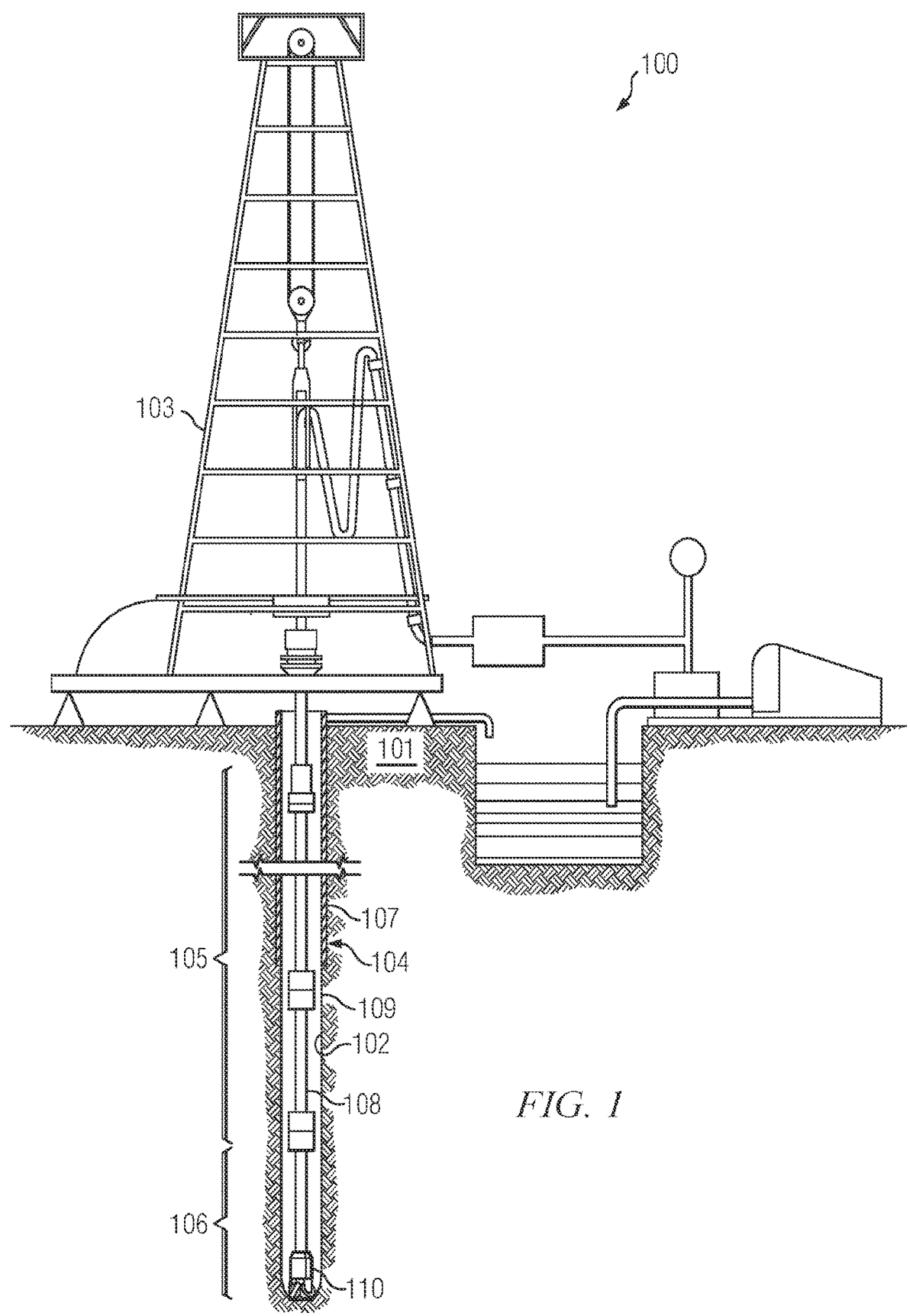
FIG. 1 depicts an example of a drilling system.

FIG. 1 shows one example of a drilling system 100 for drilling an earth formation 101 to form a wellbore 102. The drilling system 100 includes a drilling rig 103 used to turn a drilling tool assembly 104 which extends downward into the wellbore 102. The drilling tool assembly 104 may include a drill string 105, a bottomhole assembly (BHA) 106, and a drill bit 110, attached to the downhole end of drill string 105.

The drill string 105 may include several joints of drill pipe 108 connected end-to-end through tool joints 109. The drill string 105 transmits drilling fluid through a central bore and transmits rotational power from the drilling rig 103 to the BHA 106. In some embodiments, the drill string 105 may further include additional components such as subs, pup joints, etc. The drill pipe 108 provides a hydraulic passage through which drilling fluid is pumped from the surface. The drilling fluid discharges through selected-size nozzles, jets, or other orifices in the bit 110 for the purposes of cooling the bit 110 and cutting structures thereon, and for lifting cuttings out of the wellbore 102 as it is being drilled.

The BHA 106 may include the bit 110 or other components. An example BHA 106 may include additional or other components (e.g., coupled between to the drill string 105 and the bit 110). Examples of additional BHA components include drill collars, stabilizers, measurement-while-drilling (MWD) tools, logging-while-drilling (LWD) tools such as an electromagnetic measurement tool, downhole motors, underreamers, section mills, hydraulic disconnects, jars, vibration or dampening tools, other components, or combinations of the foregoing. The BHA 106 may further include a rotary steerable system (RSS). The RSS may include directional drilling tools that change a direction of the bit 110, and thereby the trajectory of the wellbore.

In general, the drilling system 100 may include other drilling components and accessories, such as special valves (e.g., kelly cocks, blowout preventers, and safety valves). Additional components included in the drilling system 100 may be considered a part of the drilling tool assembly 104, the drill string 105, or a part of the BHA 106 depending on their locations in the drilling system 100.

The drill bit 110 in the BHA 106 may be any type of bit suitable for degrading downhole materials. For instance, the bit 110 may be a drill bit suitable for drilling the earth formation 101. Example types of drill bits used for drilling earth formations are fixed-cutter or drag bits. In other embodiments, the bit 110 may be a mill used for removing metal, composite, elastomer, other materials downhole, or combinations thereof. For instance, the bit 110 may be used with a whipstock to mill into casing 107 lining the wellbore 102. The bit 110 may also be a junk mill used to mill away tools, plugs, cement, other materials within the wellbore 102, or combinations thereof. Swarf or other cuttings formed by use of a mill may be lifted to surface, or may be allowed to fall downhole.

It will be understood by those of ordinary skill in the art that the deployment illustrated on FIG. 1 is merely an example. For example, disclosed embodiments are not limited to logging while drilling operations. The antenna calibrations as described herein may also be used while using a drill string in wash down mode where drilling is not actively occurring, with wireline logging tools after drilling a wellbore, or at any other time.

Figure 2A:
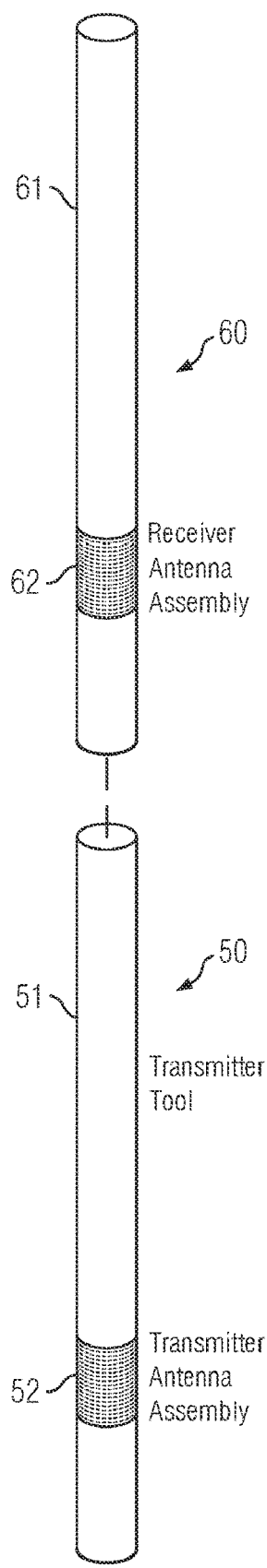
FIGS. 2A and 2B depict example electromagnetic measurement tools suitable for use in the drilling system of FIG. 1.
Figure 2B:
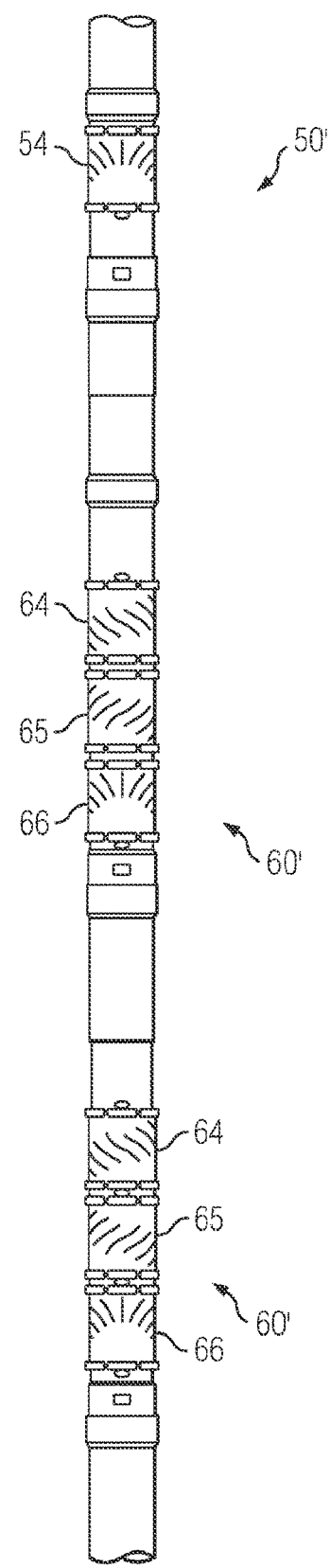

FIGS. 2A and 2B depict example electromagnetic logging tool embodiments that may be deployed, for example, in the BHA 106 depicted on FIG. 1. In some electromagnetic logging tools (e.g., LWD resistivity tools), transmitter receiver spacings can be modified such that the transmitter is spaced from about 10 to more than 200 feet away from one or more receivers, depending on the measurement application/objectives. One example, of a modular tool configuration is depicted on FIG. 2A. The depicted electromagnetic measurement tool embodiment includes transmitter and receiver subs 50 and 60. A transmitter sub (or tool) 50 includes an electromagnetic transmitter 52 deployed on a transmitter collar 51. A receiver sub (or tool) 60 includes an electromagnetic receiver 62 deployed on a receiver collar 61. When deployed in a drill string (e.g., drill string 105 on FIG. 1), the transmitter and receiver subs 50 and 60 may be axially spaced apart substantially any suitable distance to achieve a desired measurement depth (e.g., in a range from about 10 to about 100 or 200 feet or more depending on the measurement objectives). Moreover, multiple receiver subs may be used. While not shown, one or more other BHA tools (such as other LWD tools) may be deployed between the subs 50 and 60.

FIG. 2B depicts an embodiment including a single transmitter sub 50' and multiple receiver subs 60'. In the depicted embodiment, the transmitter sub 50' includes a tilted transmitting antenna 54 and each of the receiver subs 60' includes three (first, second, and third) tilted receiving antennas 64, 65, and 66 azimuthally offset (rotated) from one another by about 120 degrees. It will of course be understood that the disclosed embodiments are not limited to embodiments employing tilted antennas. Substantially any suitable antennas may be utilized, for example, including axial antennas, transverse antennas, and tilted antennas.

As is known to those of ordinary skill in the art, an axial antenna is one whose moment is substantially parallel with the longitudinal axis of the tool. Axial antennas are commonly wound about the circumference of the logging tool such that the plane of the antenna is substantially orthogonal to the tool axis. A transverse antenna is one whose moment is substantially perpendicular to the longitudinal axis of the tool. A transverse antenna may include, for example, a saddle coil (e.g., as disclosed in U.S. Patent Publications 2011/0074427 and 2011/0238312). Tilted antennas are commonly wound about the circumference of the logging tool such that the plane of the antenna is angled (or tilted) with respect to the tool axis (e.g., at an angle of about 45 degrees). Each of the above antenna configurations are well known in the industry.

With reference again to FIG. 2B, example electromagnetic logging tools may include substantially any suitable number of transmitter and receiver subs including substantially any number of corresponding transmitting and receiving antennas. For example only, the depicted electromagnetic logging tool includes a single transmitter sub 50' and a plurality of spaced apart receiver subs 60' (e.g., a plurality of receiver subs each of which includes first, second, and third tilted receiving antennas). The disclosed embodiments are, of course, not limited in these regards.

According to the described embodiments the terms "transmitter" and "receiver" are used to describe different functions of an antenna, as if they were different types of antennas. It will be understood that this is for illustration purposes. A transmitting antenna and a receiving antenna have the same physical characteristics, and one of ordinary skill in the art would appreciate that the principle of reciprocity applies and that a radiating element may be used as a transmitter at one time and as a receiver at another. Thus, any specific description of transmitters and receivers in a particular tool embodiment should be construed to include the complementary configuration, in which the "transmitters" and the "receivers" are switched. Furthermore, in this description, a "transmitter" or a "receiver" is used in a general sense and may include a single radiating element, two radiating elements, or three radiating elements.

It will be further understood that during electromagnetic measurements, a transmitting antenna and a receiving antenna are electromagnetically coupled to one another. For example, the transmitting antenna may be energized (e.g., with an alternating electrical current) and an induced voltage may be measured on the receiving antenna. Of course, based on reciprocity, the receiving antenna may be equivalently energized and an induced voltage may be measured on the transmitting antenna. The disclosed embodiments are explicitly not limited in these regards.

The use of electromagnetic measurements (e.g., propagation and induction measurements) is known in the downhole drilling arts. In such measurements, transmitting and receiving antennas are electromagnetically coupled via firing a transmitting antenna (applying a time varying electric current to the antenna) to produce a corresponding time varying magnetic field in the local environment (e.g., the tool collar and the formation). The magnetic field in turn induces electrical currents (eddy currents) in the conductive formation. These eddy currents further produce secondary magnetic fields which may produce a voltage response in a receiving antenna. The measured voltage(s) in the receiving antennas can be processed, as is known to those of ordinary skill in the art, to obtain one or more properties of the formation. As noted above, electromagnetic measurements may make use of substantially any suitable antenna configuration, for example, one or more axial, transverse, tilted, biaxial, and/or triaxial antenna arrangements.

With continued reference to FIGS. 2A and 2B, it will be appreciated that certain ones of the transmitting and receiving antennas in an electromagnetic logging tool have similar construction and may be intended to have the same size and shape such that they have substantially identical magnetic moments. However, variations in antenna dimensions that commonly result from manufacturing tolerances can lead to magnetic moment variations, which in turn can lead to measurement variation (or errors) from one antenna to another (e.g., variation in the measured amplitude and/or phase from one antenna to another) when making electromagnetic measurements. In certain embodiments (and applications) correction of the errors resulting from these variations may improve measurement accuracy. Traditional air calibration methods and modeling calibration methods may be unsuitable for achieving a highly accurate and reliable calibration.

Figure 3:
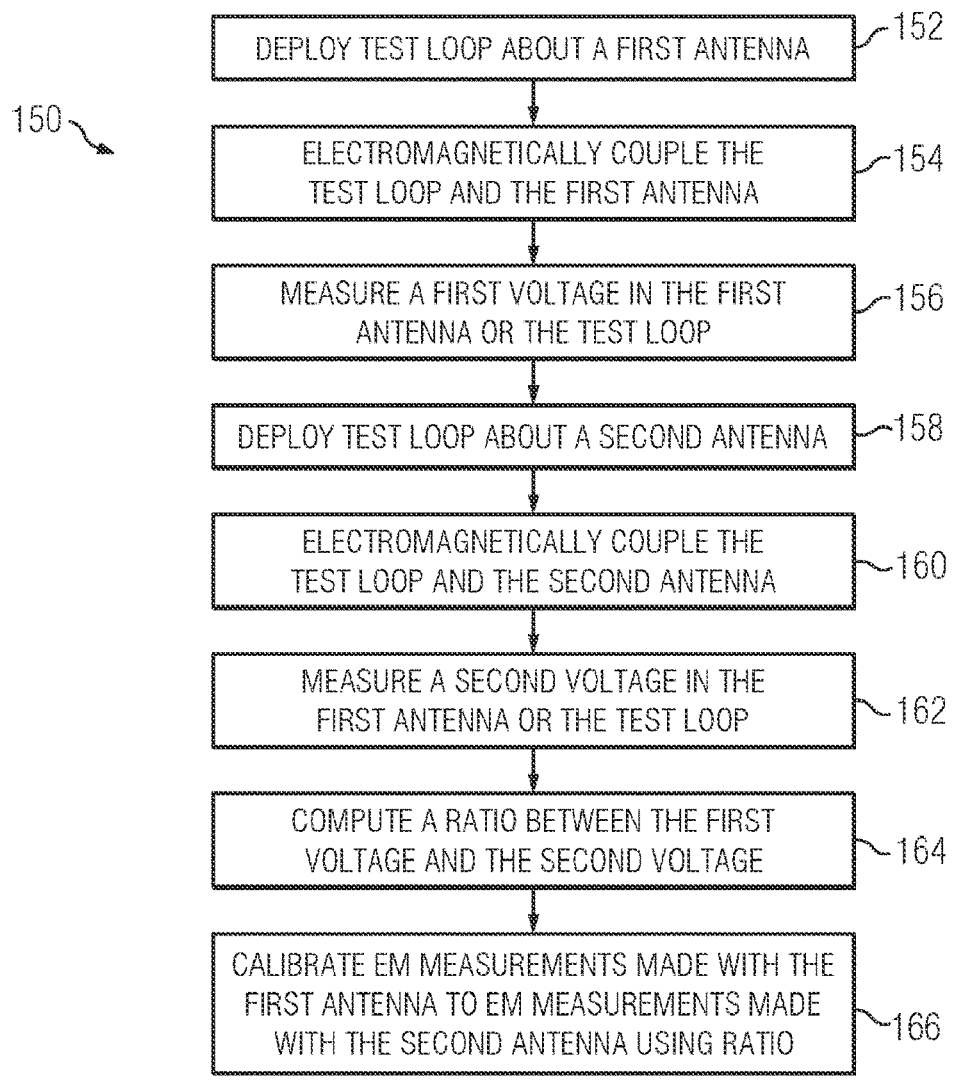
FIG. 3 depicts a flow chart of one example method embodiment for calibrating at least one antenna in an electromagnetic measurement tool.

FIG. 3 depicts a flow chart of one example method embodiment 150 for calibrating at least one antenna (e.g., antennas 64, 65, and 66) in an electromagnetic measurement tool. As described in more detail below, a test loop is deployed about a first antenna in the electromagnetic measurement tool at 152. The test loop and the first antenna are electromagnetically coupled at 154 and a corresponding induced voltage is measured at 156 in the test loop or the first antenna. For example, an alternating current may be generated in the test loop at 154 to induce a corresponding alternating voltage in the first antenna which may be measured at 156. In some embodiments, an alternating current may be generated in the first antenna at 154 and the corresponding induced voltage measured in the test loop at 156.

The test loop is then deployed about a second antenna in the electromagnetic measurement tool at 158 (e.g., by moving the test loop axially along the tool from the first antenna to the second antenna). The test loop and the second antenna are electromagnetically coupled at 160 and a corresponding voltage is measured at 162 in the test loop or the second antenna. As described above, an alternating current may be generated in the test loop or the second antenna at 160 and the corresponding alternating voltage measured in the second antenna or test loop at 162.

A ratio (also sometimes referred to as a gain ratio or a gain correction ratio) is computed in 164 between the first voltage measured at 156 and the second voltage measured at 162. This ratio may be used to calibrate at 166 electromagnetic (EM) measurements made with the first antenna to electromagnetic measurements made with the second antenna. For example, as described in more detail below, voltage measurements made with the first antenna may be multiplied by the ratio to calibrate the measurements with corresponding measurements made with the second antenna.

Figure 4:
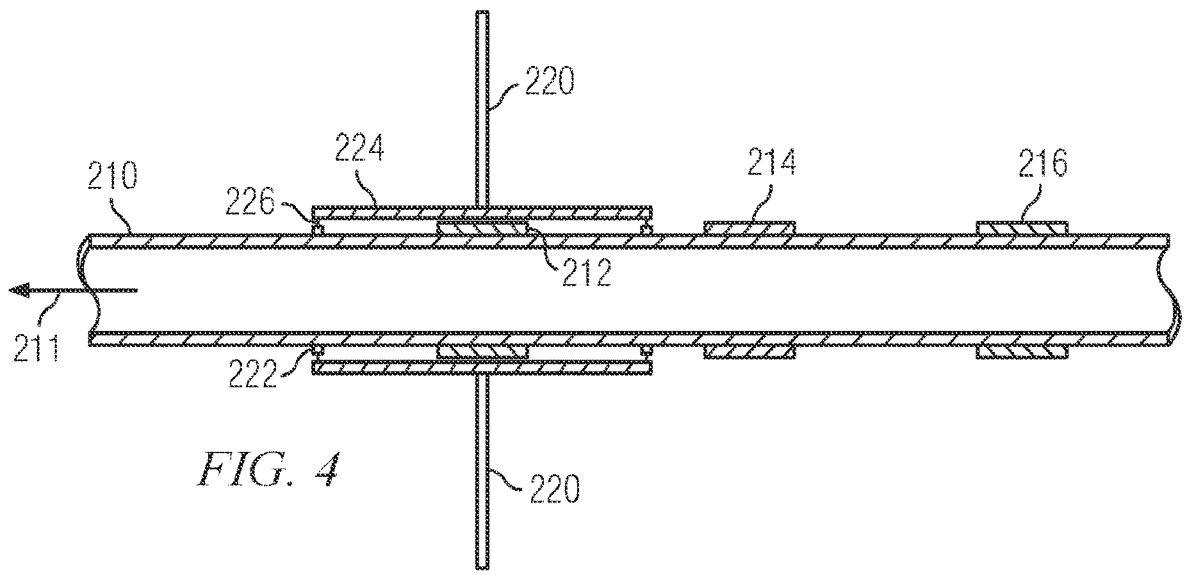
FIG. 4 depicts a cross sectional view of an example test loop deployed about an antenna on an example electromagnetic measurement tool.

FIG. 4 depicts a cross sectional view of an example test loop 220 deployed about an example electromagnetic measurement tool 210 including first, second, and third adjacent antennas 212, 214, and 216. In the depicted embodiment, the test loop 220 is deployed about the first antenna 212. Measurement tool 210 may include, for example, receiver sub 60 (FIG. 2B) with the first, second, and third antennas 212, 214, and 216 corresponding to the first, second, and third tilted receiving antennas 64, 65, and 66 (although the disclosed embodiments are expressly not limited in this regard). While substantially any suitable test loop may be employed, test loop 220 may advantageously include an axial test loop (having a moment that is parallel or coincident with an axis 211 of the measurement sub 210). The test loop may, in some embodiments, include a tilted test loop.

Figure 5:
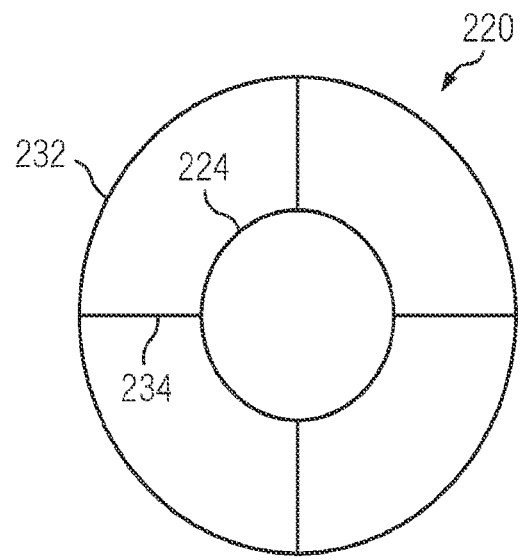
FIG. 5 depicts a cross sectional view of the test loop shown on FIG. 4.

FIG. 5 depicts a cross sectional view of test loop 220 in which the cross section is orthogonal to that shown in FIG. 4 (i.e. looking up or down the measurement tool axis 211). The test loop 220 may include one or more wraps of antenna wire 232, spaced apart from the antenna 212 (FIG. 4) via support members 234 and a circular guide (not shown). It will be understood that the guide and antenna wire 232 of the test loop 220 are not necessarily circular (e.g., the guide and antenna wire may be elliptical in a tilted test loop).

With continued reference to FIGS. 4 and 5, the calibration may be performed via installing (deploying) the test loop 220 over the tool antenna 212, (e.g., with the wrap(s) of antenna wire 232 encircling the tubular antenna 212 as depicted on FIG. 4). In certain advantageous embodiments, such installation (deployment) of the test loop 220 may be performed with high placement accuracy and/or repeatability. Such high placement accuracy and repeatability can be achieved any number of ways, for example, using alignment features on the measurement sub body 210, using alignment rings that align with features on the measurement sub body 210, using an alignment sleeve 224 attached to the test loop 220 that aligns with features on the sub body 210 or alignment rings, and/or any combination of the above. For example, as depicted on FIG. 4, the test loop may be deployed on an alignment sleeve 224 that is configured (sized and shaped) for deployment about the measurement sub 210. Alignment rings 222 may be deployed on the measurement tool 210 at predetermined locations on the tool or may have features that mate with the tool body 210 at designated locations. The alignment sleeve 224 may have openings that align with openings in the alignment rings 222. Pins 226 may be inserted to secure the test loop 220 in location with respect to antenna 212. Other suitable alignment methods may, of course, be utilized. The test loop installation and alignment procedure may be followed with each of the antennas on the measurement tool 210.

Figure 6:
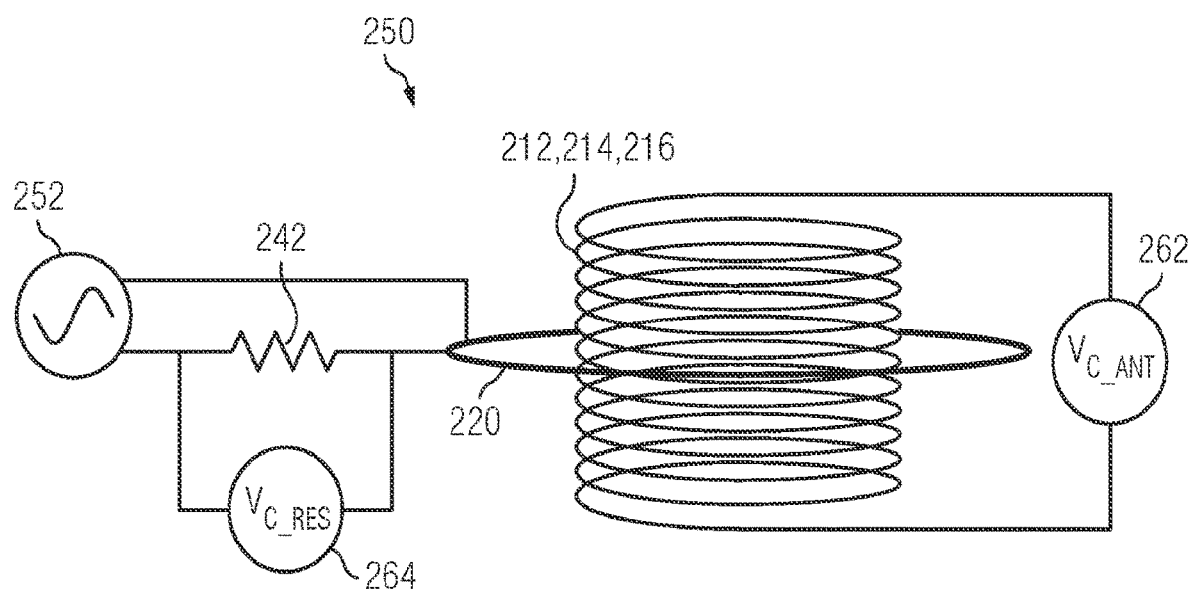
FIG. 6 depicts a schematic of a calibration assembly including the test loop, the electromagnetic antenna, and corresponding electronics.

FIG. 6 depicts a schematic of an example calibration assembly 250 including the test loop 220, the tool antenna 212, and corresponding electronics. In this particular schematic, the test loop 220 is configured as a transmitter and the tested antenna 212 is configured as a receiver (although as noted above the disclosed embodiments are not limited in this regard). The test loop 220 and a normalizing resistor 242 are connected in series with a signal generator 252. The signal generator 252 is energized to apply an alternating current through the test loop 220 and the resistor 242 and thereby to transmit an electromagnetic field about the antenna 212. The induced voltage in the antenna 212 may be measured, for example, using voltage sensor 262. The voltage drop across the resistor 242 may also be measured, for example, using voltage sensor 264. It will be understood that voltage sensor 262 and voltage sensor 264 may be the same voltage sensor and that the assembly may include a switch (or switching assembly) configured to connect the voltage sensor to either the antenna 212 or the resistor 242.

The signal generator 252 may be configured to generate the alternating current at substantially any suitable frequency or frequencies. Electromagnetic measurement tools are commonly configured to make electromagnetic measurements at multiple distinct measurement frequencies, e.g., at 3, 4, 6, or 8 distinct frequencies. For example, some tool embodiments may be configured to make electromagnetic measurements at 1 kHz, 2 kHz, 3 kHz, 6 kHz, 12 kHz, 24 kHz, 48 kHz, 96 kHz, and/or 192 kHz (or at any other desired frequencies). It may therefore be advantageous to configure the signal generator 252 to generate the alternating current at the one or more particular frequencies at which the tool is configured to make measurements thereby enabling the tool to be calibrated at those frequencies.

With reference again to FIG. 3, the electromagnetic coupling in 154 and 160 may be performed at the particular frequency (or frequencies) at which the tool is configured to make electromagnetic measurements. For example, the electromagnetic coupling and corresponding voltage measurements may be made at 154 and 156 (and at 160 and 162) at substantially any number of suitable frequencies (e.g., those frequencies listed above). The electromagnetic coupling and voltage measurements may be made at a first frequency. And then a second frequency. And so on. Ratios may then be computed at 164 at each of the frequencies such that the electromagnetic measurements may be calibrated at each of the frequencies in 166.

Upon securing the test loop 220 to the measurement sub 210 (about the antenna 212) the sub 210 and test loop 220 may be lifted away from metallic objects to reduce or eliminate interference from those objects. For example, the collar may be lifted at least 8 feet (~2.5 m) and thereby moved up and away from the floor, ceiling, walls, and large metallic/magnetic objects.

A data acquisition system may be connected to the test loop and the antenna 212 (either before or after lifting the assembly). The acquisition system may be configured to measure the voltage (e.g., the amplitude or the amplitude and phase) across the antenna 212 and the voltage (e.g., the amplitude or the amplitude and phase) across the normalizing resistor 242 when the signal generator is energized. The data acquisition system may include a reference from the signal generator 252 to enable measurement of the phase delay between the alternating current in the test loop 220 and the measured voltage in the antenna 212. The signal generator 252 and data acquisition system may be integrated into a single device or may be located in separate devices.

With continued reference to FIG. 3, the test loop 220 and the antenna may be electromagnetically coupled at 154 while the assembly is lifted via energizing the signal generator. The data acquisition system may measure the complex voltage (e.g., including amplitude and phase) in the first antenna 212 and the complex voltage across the normalizing resistor 242 at 156. As noted above, the electromagnetic coupling and corresponding voltage measurements may be performed at substantially any number of frequencies at which the tool operates. In some embodiments, the electromagnetic coupling and voltage measurements may be performed at each of the frequencies at which the tool operates.

Once the first antenna has been tested at all desired frequencies, the assembly may be lowered and the test loop 220 (and associated alignment systems) moved to the next (second) antenna 214. The assembly may then be lifted again and the data acquisition system connected as described above. An identical procedure may then be followed to electromagnetically couple the test loop 220 and the second antenna 214 and to measure corresponding complex voltages in the second antenna 214 and across the normalizing resistor 242 at the one or more desired frequencies. This procedure may then be optionally followed for a third antenna 216 and substantially any number of other antennas as desired.

As described above, the disclosed calibration procedure calibrates one antenna (e.g., the first antenna) with respect to another antenna (e.g., the second antenna). In this calibration, the gain (e.g., the moment) of the first antenna is normalized to that of the second antenna. For example, in the embodiment described above with respect to FIGS. 2B and 4, the middle antenna (the second antenna) 214 may be used as the reference antenna and the gain of the first antenna 212 and the third antenna 216 may be adjusted by a ratio (or gain ratio) so that the gain (or moment) is equalized across the three antennas. Antenna gain ratios between the first antenna 212 and the second antenna 214 and between the third antenna 216 and the second antenna 214 may be calculated, for example, as follows:

$$g_{C\_ANT\_A1} = \frac{V_{C\_ANT\_A1}}{V_{C\_ANT\_A2}} \cdot \frac{V_{C\_RES\_A2}}{V_{C\_RES\_A1}} \quad (1)$$

$$g_{C\_ANT\_A3} = \frac{V_{C\_ANT\_A3}}{V_{C\_ANT\_A2}} \cdot \frac{V_{C\_RES\_A2}}{V_{C\_RES\_A3}}$$

where $g_{C\_ANT\_A1}$ and $g_{C\_ANT\_A3}$ represent the gains (e.g., complex valued gains) of the first and third antennas with respect to the second antenna, $V_{C\_ANT\_A1}$, $V_{C\_ANT\_A2}$, and $V_{C\_ANT\_A3}$, represent the voltage measurements (e.g., complex valued voltage measurements) in the first, second, and third antennas when the test loop is coupled with those antennas, and $V_{C\_RES\_A1}$, $V_{C\_RES\_A2}$, and $V_{C\_RES\_A3}$ represent the voltage measurements (e.g., complex valued voltage measurements) across the normalizing resistor when the test loop is coupled with the first, second, and third antennas.

With continued reference to Equation 1, the gains are computed by taking a product to two ratios, a first ratio of the voltage in the measured (calibrated) antenna to the voltage in the reference antenna and a second ratio of the voltage in the normalizing resistor when the test loop is electromagnetically coupled with the reference antenna to the voltage in the normalizing resistor when the test loop is electromagnetically coupled with the measured (calibrated) antenna.

The above described antenna gain ratios or calibration coefficients (e.g., antenna gain calibration coefficients) may be programmed into the measurement sub and used to correct electromagnetic measurements. The ratios given in Equation 1 may optionally be combined with other calibration coefficients to obtain corrected gain ratios. For example, further calibrations may be performed, before, during, or after operating the downhole tool to compute a gain calibrated electromagnetic measurement. The combined calibration may include additional corrections that may be calculated prior to or during the run as shown in the equations below:

$$G_{A1} = g_{C\_PA\_A1} \cdot g_{C\_AHG\_A1} \cdot g_{C\_ALG\_A1} \cdot g_{C\_ANT\_A1}$$

$$G_{A3} = g_{C\_PA\_A3} \cdot g_{C\_AHG\_A3} \cdot g_{C\_ALG\_A3} \cdot g_{C\_ANT\_A3} \quad (2)$$

where $G_{A1}$ and $G_{A3}$ represent the combined gain ratios for the first and third antennas, $g_{C\_PA\_A1}$ and $g_{C\_PA\_A3}$ represent a calibration of a preamp in the measurement sub, $g_{C\_AHG\_A1}$ and $g_{C\_AHG\_A3}$ represent a calibration of the acquisition board with high gain, and $g_{C\_ALG\_A1}$ and $g_{C\_ANT\_A3}$ represent a calibration of the acquisition board with low gain. For example, in some embodiments, a receiver sub may perform a self-test while operating downhole to account for temperature and/or other variations, and that resulting calibration or gain ratio, may be included in the overall gain real time to provide a more accurate calibration. While some calibrations have been described above, more or less calibrations can be combined with the antenna gain ratio calibration to arrive at an overall calibration/correction. As noted above, the calibrations may be done pre-run, during a run, post-run, or some combination thereof. As also described above, the voltages and gain ratios described above may be complex quantities including amplitude and phase information, however, the disclosed embodiments are not limited in this regard as the voltages and gain ratios may also be real quantities including only amplitude information.

It will be understood that the gain ratios in Equation 1 and 2 may be computed at each measurement frequency (e.g., at 1 kHz, 2 kHz, 3 kHz, 6 kHz, 12 kHz, 24 kHz, 48 kHz, 96 kHz, and/or 192 kHz or any other desired frequency) as described above. The downhole tool may be programmed to combine these gain ratios (as expressed in Equation 1 or 2) with the downhole electromagnetic measurements. For example, at any particular frequency, the measured voltages at the first, second, and third antennas may be calibrated, for example, as follows (in some embodiments including first, second, and third antennas such as described above with respect to FIGS. 2B and 4):

$$V_{CAL\_A1} = G_{A1} \cdot V_{MEAS\_A1}$$

$$V_{CAL\_A3} = G_{A3} \cdot V_{MEAS\_A3}$$

$$V_{CAL\_A2} = V_{MEAS\_A2} \quad (3)$$

where $V_{CAL\_A1}$, $V_{CAL\_A2}$, and $V_{CAL\_A3}$ represent the calibrated voltages at the first, second, and third antennas, $V_{MEAS\_A1}$, $V_{MEAS\_A2}$, and $V_{MEAS\_A3}$ represent the measured voltages at the first, second, and third antenna, and $G_{A1}$ and $G_{A3}$ represent the gain ratios computed above. In this embodiment the measured voltages on the first and third antennas are calibrated with respect to second antenna (which acts in this example as the reference). The voltage on the second antenna is therefore not calibrated/corrected in this example.

Described above are embodiments for correcting the gain component of the antenna magnetic moment of a receiver sub. In some embodiments, in a similar manner as to correcting for the gain component of the antenna magnetic moment, the antenna tilt angle component may also be calculated and calibrated. In such embodiments, the voltage measurements (obtained using a test loop as described above and in more detail below) may first be processed to compute a tilt angle for each of the first and second or first, second, and third (and so on) antennas. The computed ratio then further includes a ratio of a function of the tilt angles (e.g., a ratio of the cosines of the tilt angles or a ratio of the sines of the tilt angles as described in more detail below).

Figure 7A:
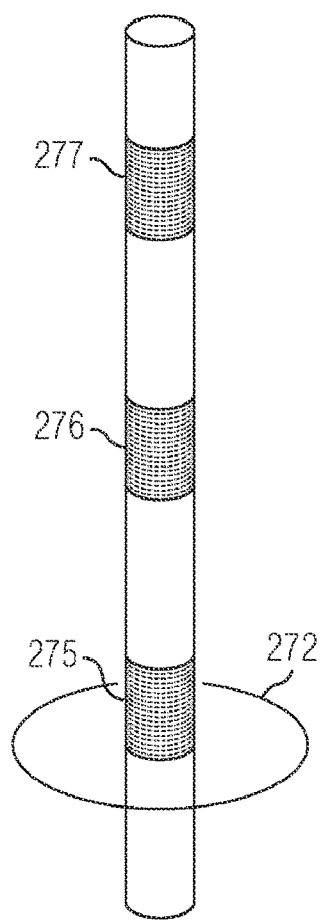
FIGS. 7A, 7B, and 7C depict axial (7A), transverse (7B), and tilted (7C) test loops deployed about an example antenna.
Figure 7B:
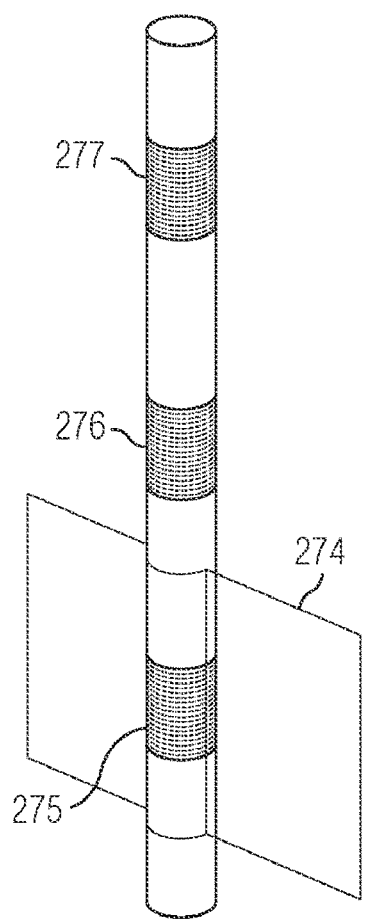

In some embodiments, the antenna tilt angle may be computed from voltage measurements obtained using two distinct test loops (that are angularly offset from one another) placed sequentially over the antennas. Example test loops are depicted on FIGS. 7A and 7B in which FIG. 7A depicts an axial test loop 272 deployed about tilted 275 and FIG. 7B depicts a transverse test loop 274 deployed about antenna tilted 275. While the use of axial and transverse test loops may be advantageous, the disclosed embodiments are not so limited. In some embodiments, voltage measurements may be made, using a data acquisition system as described above, when the axial test loop 272 is deployed about the antenna 275. Voltage measurements may then be made with the transverse test loop 274 deployed about the antenna. Similar measurements may then be made other antennas such as antennas 276 and 277. These voltage measurements may then be processed to compute the antenna tilt angle, for example, as follows:

$$Tilt_x = \tan^{-1}\left(N \cdot \frac{V_{C\_T\_x}}{V_{C\_A\_x}}\right) \quad (4)$$

where $Tilt_x$ represents the tilt angle of antenna x (e.g., antenna 1, antenna 2, antenna 3, and so on), $V_{C\_T\_x}$ represents the measured voltage when the antenna is coupled with the transverse test loop, $V_{C\_A\_x}$ represents the measured voltage when the antenna is coupled with the axial test loop, and N represents a normalization factor that is a magnetic moment ratio between the axial test loop and the transverse test loop. It will be appreciated that N may be accurately determined from the test loop dimensions and the voltages in the normalizing resistor.

The gain ratios may then be computed, for example, as follows:

$$g_{C\_ANT\_A1\_Axial} = \frac{V_{C\_A\_1}}{V_{C\_A\_2}} \cdot \frac{\cos(Tilt1)}{\cos(Tilt2)} \cdot \frac{V_{C\_RES\_A\_2}}{V_{C\_RES\_A\_1}} \quad (5)$$

$$g_{C\_ANT\_A1\_Trans} = \frac{V_{C\_T\_1}}{V_{C\_T\_2}} \cdot \frac{\sin(Tilt1)}{\sin(Tilt2)} \cdot \frac{V_{C\_RES\_T\_2}}{V_{C\_RES\_T\_1}}$$

$$g_{C\_ANT\_A1} = 0.5 \left( g_{C\_ANT\_A1\_Axial} + g_{C\_ANT\_A1\_Trans} \right)$$

where $g_{C\_ANT\_A1\_Axial}$ and $g_{C\_ANT\_A1\_Trans}$ represent the gains (e.g., complex valued gains) of the first antenna with respect to the second antenna, $V_{C\_A\_1}$, $V_{C\_A\_2}$, $V_{C\_T\_1}$, and $V_{C\_T\_2}$ are the coupling voltages (e.g., complex valued voltage measurements) as defined above with respect to Equation 4, and $V_{C\_RES\_A1}$, $V_{C\_RES\_A2}$, $V_{C\_RES\_T\_1}$, and $V_{C\_RES\_T\_2}$ represent the voltage measurements (e.g., complex valued voltage measurements) across the normalizing resistor when the axial and transverse test loops are coupled with the first and second antennas. It will be appreciated that equation 5 may also be used to compute gains for a third (or fourth, etc.) antenna with respect to the second antenna simply by substituting the antenna 1 voltage measurements and tilt angle with antenna 3 voltage measurements and tilt angle (and so one).

In another embodiment, the tilt angles and gains (gain ratios) may be computed using a tilted test loop (a test loop whose moment is tilted with respect to the tool axis). One example of a tilted test loop is depicted on FIG. 7C in which a tilted test loop 280 is deployed about antenna 276 in an electromagnetic measurement tool including first, second, and third tilted antennas 275, 276, and 277. In the depicted embodiment, the tilted antenna 280 is tilted at an angle of 45 degrees with respect to the tool axis 211 as depicted (although the disclosed embodiments are not limited in this regard). Tilted test loops are described in more detail with respect to U.S. Patent Publication 2014/0156211, which is incorporated by reference in its entirety herein.

Figure 7C:
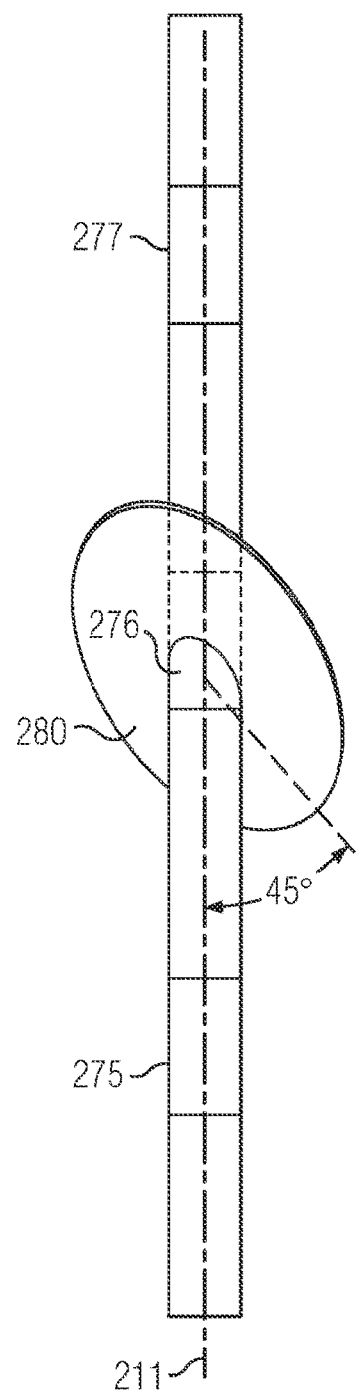

For example, the tilted test loop 280 may be deployed on an antenna as depicted on FIG. 7C. The tilted test loop may be rotated to multiple known azimuth angles about the measurement tool (about the antenna). Corresponding coupling voltages may be measured at each azimuth angle when the test loop and the antenna are electromagnetically coupled (as described above). The voltage measurements may be fit to a sine function (as a function of the azimuth angle) to compute the tilt angle of the antenna. This procedure may be performed for selected antennas on the measurement tool (e.g., the first, second, and third adjacent antennas as described above).

The gain ratios may then be computed, for example, as follows:

$$g_{C\_ANT\_A1} = \frac{V_{C\_TTL\_0\_1}}{V_{C\_TTL\_0\_2}} \cdot \frac{\cos(45 - Tilt1_{TTL})}{\cos(45 - Tilt2_{TTL})} \cdot \frac{V_{C_{RES_{TTL0_2}}}}{V_{C_{RES_{TTL0_1}}}} \quad (6)$$

where $Tilt1_{TTL}$ and $Tilt2_{TTL}$ represent the tilt angles of the first and second antennas as determined using the tilted test loop (as described above), $V_{C\_TTL0\_1}$ and $VT_{C\_TTL0\_2}$ represent the coupling voltages measured (e.g., complex valued voltage measurements) when the tilted test loop is azimuthally (rotationally) aligned with and electromagnetically coupled with the first and second antennas, and $V_{C\_RES\_TTL0\_2}$ and $V_{C\_RES\_TTL0\_1}$ represent the voltage measurements (e.g., complex valued voltage measurements) across the normalizing resistor when the tilted test loop is azimuthally (rotationally) aligned with and electromagnetically coupled with the first and second antennas. It will be appreciated that equation 6 may also be used to compute gains for a third (or fourth, etc.) antenna with respect to the second antenna simply by substituting the antenna 1 voltage measurements and tilt angle with antenna 3 voltage measurements and tilt angle (and so one).

With continued reference to Equations 5 and 6, the gains are computed by taking a product of three ratios, a first ratio of the voltage in the measured (calibrated) antenna to the voltage in the reference antenna, a second ratio of the voltage in the normalizing resistor when the test loop is electromagnetically coupled with the reference antenna to the voltage in the normalizing resistor when the test loop is electromagnetically coupled with the measured (calibrated) antenna, and a third ratio of a function (e.g., a cosine or sine function) of the tilt angle of the first antenna to the same function of the tilt angle of the second antenna.

Figure 8:
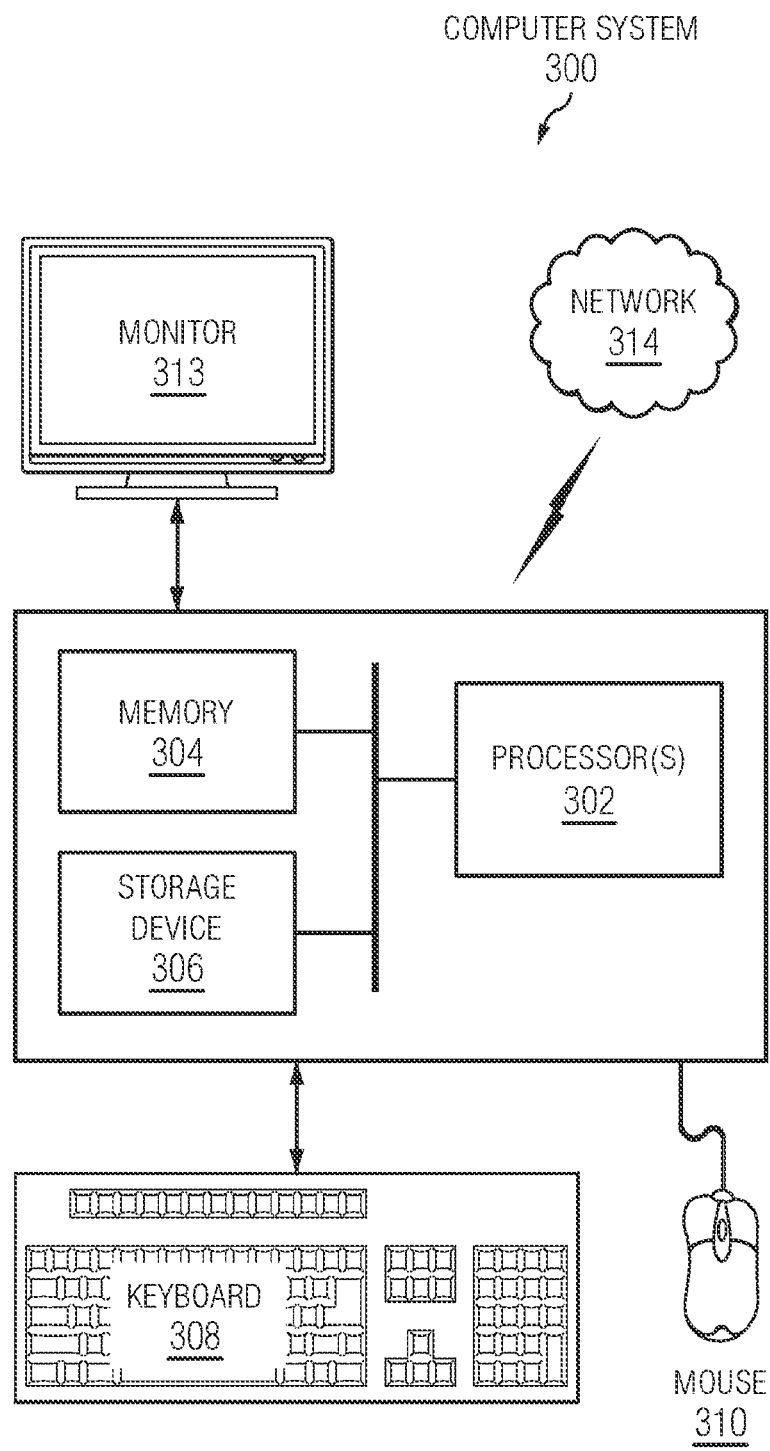
FIG. 8 depicts an example computer system.

It will be appreciated that calibration of an electromagnetic logging tool (or a portion of the calibration), may be implemented on virtually any type of computer regardless of the platform being used. For example, as shown in FIG. 8, a computer system 300 includes one or more processor(s) 302, associated memory 304 (e.g., random access memory (RAM), cache memory, flash memory, etc.), a storage device 306 (e.g., a hard disk, an optical drive such as a compact disk drive or digital video disk (DVD) drive, a flash memory stick, etc.), and numerous other elements and functionalities typical of modern computers (not shown). The computer system 300 may also include input means, such as a keyboard 308, a mouse 310, or a microphone (not shown). Further, the computer system 300 may include output means, such as a monitor 312 (e.g., a liquid crystal display (LCD), a plasma display, or cathode ray tube (CRT) monitor) or printer (not shown). The computer system 300 may be connected to a network 314 (e.g., a local area network (LAN), a wide area network (WAN) such as the Internet, or any other similar type of network) with wired and/or wireless segments via a network interface connection (not shown). Those skilled in the art will appreciate that many different types of computer systems exist, and the aforementioned input and output means may take other forms. Generally speaking, the computer system 300 includes at least the minimal processing, input, and/or output means necessary to practice one or more of the disclosed embodiments.

Further, those skilled in the art will appreciate that one or more elements of the aforementioned computer system 300 may be located at a remote location and connected to the other elements over a network. For example, the computer system may be coupled to a downhole processor deployed in an electromagnetic logging tool via a telemetry channel such as a mud pulse telemetry channel or wired drill pipe. Further, one or more embodiments may be implemented on a distributed system having a plurality of nodes, where each portion may be located on a different node within the distributed system. In one or more embodiments, the node corresponds to a computer system. In some embodiments, the node may correspond to a processor with associated physical memory. The node may correspond to a processor with shared memory and/or resources. Further, software instructions for performing one or more embodiments of reservoir engineering may be stored on a computer readable medium such as a compact disc (CD), a diskette, a tape, or any other computer readable storage device.

The computer system may be configured to compute the various calibration factors, coefficients, and quantities described above. For example, the computer system may include instructions to receive voltage from corresponding receiving antennas and test loop antennas. The computer system may further include instructions to receive electromagnetic measurements from downhole tool memory (e.g., after retrieving the tool from the wellbore). The computer system may further include instructions to compute the functions that describe changes in effective area of a transmitter and/or receiver antenna with temperature and/or pressure. The computer system may further include instructions to compute calibration factors for the reference tool receiver and transmitter, for example, as described above. The computer system may include further instructions to process these calibration quantities in combination with electromagnetic measurements (e.g., received from downhole tool memory) to compute the calibrated measurements. Moreover, the calibration quantities may be processed in combination with downhole temperature and/or pressure measurements and the electromagnetic logging measurements to compute gain calibrated measurements as described above.

As also described above, the computed calibration factors, coefficients, and quantities may be stored in downhole memory and may then be applied to the electromagnetic measurements using a downhole processor (e.g., a processor deployed in the electromagnetic logging tool) to compute the calibrated measurements. For example, calibrations may be computed using computer system 300 and stored in downhole memory. A mathematical function describing changes in effective area of a transmitter and/or receiver antenna with temperature and/or pressure may also be stored in downhole memory. In such embodiments, the downhole processor may be configured to process downhole temperature and/or pressure measurements in combination with the calibration quantities stored in memory to compute temperature and/or pressure corrected quantities. The downhole processor may be further configured to multiply selected electromagnetic logging measurements by the corrected quantities and/or by the original calibration quantities to compute the gain calibrated electromagnetic logging measurements downhole.

When gain calibrated measurements are used in a while drilling tool, those measurements may be used to determine information about the wellbore. Using that determined information, changes may be made to drilling. For example, in some embodiments a downhole tool may be a geosteering tool and may be able to automatically follow a trajectory adjacent to a formation boundary. In some embodiments, the corrected measurements may be sent uphole, analyzed, and a driller or an autodriller may modify the drilling plan, e.g., by steering in a different direction.

It will be understood that the disclosure includes numerous embodiments. These embodiments include, but are not limited to, the following embodiments.

In a first embodiment, of calibrating an electromagnetic measurement tool is disclosed. The method includes (a) deploying a test loop about a first antenna in the in the electromagnetic measurement tool; (b) electromagnetically coupling the test loop and the first antenna; (c) measuring a first voltage in the first antenna or in the test loop induced by said electromagnetically coupling the test loop and the first antenna; (d) deploying the test loop about a second antenna in the electromagnetic measurement tool; (e) electromagnetically coupling the test loop and the second antenna; (f) measuring a second voltage in the second antenna or in the test loop induced by said electromagnetically coupling the test loop and the second antenna; and (g) computing a ratio of the first voltage to the second voltage.

A second embodiment may include the first embodiment and may further comprise: (h) calibrating electromagnetic measurements made with the first antenna to electromagnetic measurements made with the second antenna using the computed ratio.

A third embodiment may include the second embodiment, wherein (h) further comprises: (h1) storing the ratio to memory in the electromagnetic measurement tool; (h2) deploying the electromagnetic measurement tool in a subterranean wellbore; (h3) causing the electromagnetic measurement tool to make first electromagnetic measurements with the first antenna and second electromagnetic measurements with the second antenna while deployed in the wellbore; and (h4) multiplying the first electromagnetic measurements by the ratio to obtain calibrated first electromagnetic measurements.

A fourth embodiment may include any one of the first three embodiments, wherein (a) and (d) further comprise lifting the electromagnetic measurement tool and the test loop up and away from a floor, walls, and other electrically conducting materials.

A fifth embodiment may include any one of the first four embodiments, wherein the test loop is an axial test loop, having a moment axis coincident with an axis of the measurement tool, and the first and second antennas are tilted antennas.

A sixth embodiment may include the fifth embodiment, wherein the first and second tilted antennas are rotationally offset from one another on the measurement tool.

A seventh embodiment may include any one of the first six embodiments wherein: (b) comprises applying an alternating electric current to the test loop or the first antenna; and (e) comprises applying an alternating electric current to the test loop or the second antenna.

An eighth embodiment may include the seventh embodiment, wherein (b) further comprises applying the alternating electric current to (i) the test loop or the first antenna and to (ii) a normalizing resistor that is in series with the test loop or the first antenna; and (e) further comprises applying the alternating electric current to (i) the test loop or the second antenna and (ii) the normalizing resistor that is in series with the test loop or the second antenna.

A ninth embodiment may include the eighth embodiment, wherein (c) further comprises measuring a first resistor voltage in the normalizing resistor caused by said applying the alternating electric current to the normalizing resistor; and (f) further comprises measuring a second resistor voltage in the normalizing resistor caused by said applying the alternating electric current to the normalizing resistor.

A tenth embodiment may include the ninth embodiment, wherein the gain ratio computed in (g) is a product of a first ratio and a second ratio, the first ratio being a ratio of the first voltage to second voltage and the second ratio being a ratio of the second resistor voltage to the first resistor voltage.

An eleventh embodiment may include the ninth embodiment, wherein the gain ratio computed in (g) is a product of first, second, and third ratios, the first ratio being a ratio of the first voltage to second voltage, the second ratio being a ratio of the second resistor voltage to the first resistor voltage, and the third ratio being a ratio of a function of a tilt angle of the first antenna and said function of a tilt angle of the second antenna.

A twelfth embodiment may include any one of the first eleven embodiments and may further comprise repeating (b), (c), (e), and (f) at a plurality of distinct electromagnetic frequencies.

A thirteenth embodiment may include any one of the first twelve embodiments, wherein (g) further comprises processing the first voltage to compute a first tilt angle of the first antenna; processing the second voltage to compute a second tilt angle of the second antenna; and wherein computing the ratio further comprises computing a ratio of the a function of the first tilt angle to said function of the second tilt angle.

A fourteenth embodiment may include the thirteenth embodiment, wherein the test loop is a tilted test loop; the test loop is deployed at a plurality of azimuthal angles about the first and second antennas in (a) and (d); and said first and second voltages comprise a corresponding plurality of first and second voltages measured at the plurality of azimuthal angles.

A fifteenth embodiment may include the thirteenth embodiment, wherein the test loop comprises a first axial test loop and a second transverse test loop; and the first voltage comprises first and second first voltages corresponding to the first and second test loops and the second voltage comprises first and second voltages corresponding to the first and second test loops.

In a sixteenth embodiment a system for calibrating an electromagnetic measurement tool is disclosed. The system includes a test loop configured for deployment about an antenna in an electromagnetic logging tool, the test loop including at least one wrap of antenna wire disposed on a support structure and a sleeve configured to engage the logging tool upon said deployment; a data acquisition system configured to be electrically connected with the test loop and the antenna, the data acquisition system including a signal generator configured to electromagnetically couple the test loop with the antenna when the test loop is deployed about the antenna and a voltage measuring circuit configured to measure a voltage in the test loop or the antenna when during said coupling; and a processor configured to (i) instruct the voltage measuring circuit to measure a first voltage when the test loop is electromagnetically coupled with a first antenna in the logging tool and a second voltage when the test loop is electromagnetically coupled with a second antenna in the logging tool and (ii) compute a ratio of the first voltage to the second voltage.

A seventeenth embodiment may include the sixteenth embodiment wherein the data acquisition system further includes a normalizing resistor configured to be electrically in series with the test loop or the first antenna when the data acquisition system is electrically connected with the test loop and the antenna.

An eighteenth embodiment may include the sixteenth embodiment, wherein the processor is further configured to instruct the voltage measuring circuit to measure a first resistor voltage when the test loop is electromagnetically coupled with the first antenna and a second resistor voltage when the test loop is electromagnetically coupled with the second antenna.

A nineteenth embodiment may include the sixteenth embodiment, wherein the processor is further configured to compute a product of first and second ratios, the first ratio being a ratio of the first voltage to the second voltage and the second ratio being a ratio of the second resistor voltage to the first resistor voltage.

A twentieth embodiment may include any one of the sixteenth through nineteenth embodiments, wherein: the signal generator is configured to electromagnetically couple the test loop and the antenna at a plurality of distinct frequencies; and the processor is configured to instruct the voltage measuring circuit to measure the first and second voltages at each of the plurality of distinct frequencies and to compute the ratio of the first voltage to the second voltage at each of the plurality of distinct frequencies.

The embodiments of the calibration system and method have been primarily described with reference for use with LWD resistivity tools; calibration system and method may be used in applications other than the drilling of a wellbore. In other embodiments, calibration systems according to the present disclosure may be used in wireline operations, however, other potential uses can be envisioned. Accordingly, the terms "wellbore," "borehole" and the like should not be interpreted to limit tools, systems, assemblies, or methods of the present disclosure to any particular industry, field, or environment.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. Changes that come within the meaning and range of equivalency of the claims are to be embraced within their scope.

What is claimed is:

1. A method of calibrating an electromagnetic measurement tool, the method comprising:
   (a) deploying a test loop about a first antenna in the electromagnetic measurement tool;
   (b) electromagnetically coupling the test loop and the first antenna;
   (c) measuring a first voltage in the first antenna or in the test loop induced by the electromagnetically coupling the test loop and the first antenna;
   (d) deploying the test loop about a second antenna in the electromagnetic measurement tool;
   (e) electromagnetically coupling the test loop and the second antenna;
   (f) measuring a second voltage in the second antenna or in the test loop induced by the electromagnetically coupling the test loop and the second antenna;
   (g) computing a ratio of the first voltage to the second voltage; and
   (h) calibrating electromagnetic measurements made with the first antenna to electromagnetic measurements made with the second antenna using the computed ratio, wherein calibrating the electromagnetic measurements comprises:
      (h1) storing the ratio to memory in the electromagnetic measurement tool;
      (h2) deploying the electromagnetic measurement tool in a subterranean wellbore;
      (h3) causing the electromagnetic measurement tool to make first electromagnetic measurements with the first antenna and second electromagnetic measurements with the second antenna while deployed in the wellbore; and
      (h4) multiplying the first electromagnetic measurements by the ratio to obtain calibrated first electromagnetic measurements.

2. The method of claim 1, wherein (a) and (d) further comprise lifting the electromagnetic measurement tool and the test loop up and away from a floor, walls, and other electrically conducting materials.

3. The method of claim 1, wherein the test loop is an axial test loop, having a moment axis coincident with an axis of the electromagnetic measurement tool, and the first and second antennas are tilted antennas.

4. The method of claim 3, wherein the first and second tilted antennas are rotationally offset from one another on the electromagnetic measurement tool.

5. The method of claim 1, wherein:
   (b) comprises applying a first alternating electric current to the test loop or the first antenna; and
   (e) comprises applying a second alternating electric current to the test loop or the second antenna.

6. The method of claim 5, wherein:
   (b) further comprises applying the first alternating electric current to (i) the test loop or the first antenna and to (ii) a normalizing resistor that is in series with the test loop or the first antenna; and
   (e) further comprises applying the second alternating electric current to (i) the test loop or the second antenna and (ii) the normalizing resistor that is in series with the test loop or the second antenna.

7. The method of claim 6, wherein:
   (c) further comprises measuring a first resistor voltage in the normalizing resistor caused by the applying the first alternating electric current to the normalizing resistor; and
   (f) further comprises measuring a second resistor voltage in the normalizing resistor caused by the applying the second alternating electric current to the normalizing resistor.

8. The method of claim 7, wherein the ratio computed in (g) is a product of a first ratio and a second ratio, the first ratio being a ratio of the first voltage to second voltage and the second ratio being a ratio of the second resistor voltage to the first resistor voltage.

9. The method of claim 7, wherein the ratio computed in (g) is a product of first, second, and third ratios, the first ratio being a ratio of the first voltage to the second voltage, the second ratio being a ratio of the second resistor voltage to the first resistor voltage, and the third ratio being a ratio of a function of a tilt angle of the first antenna and the function of a tilt angle of the second antenna.

10. The method of claim 1, further comprising:
    repeating (b), (c), (e), and (f) at a plurality of distinct electromagnetic frequencies.

11. The method of claim 1, wherein (g) further comprises:
    processing the first voltage to compute a first tilt angle of the first antenna;
    processing the second voltage to compute a second tilt angle of the second antenna; and
    wherein computing the ratio further comprises computing a ratio of a function of the first tilt angle to the function of the second tilt angle.

12. The method of claim 11, wherein:
    the test loop is a tilted test loop;
    the test loop is deployed at a plurality of azimuthal angles about the first and second antennas in (a) and (d); and
    the first and second voltages comprise a corresponding plurality of first and second voltages measured at the plurality of azimuthal angles.

13. The method of claim 11, wherein:
    the test loop comprises a first axial test loop and a second transverse test loop; and
    the first voltage comprises first and second first voltages corresponding to the first and second test loops and the second voltage comprises first and second second voltages corresponding to the first and second test loops.

14. A method of calibrating an electromagnetic measurement tool, the method comprising:

(a) deploying a test loop about a first antenna in the electromagnetic measurement tool;
(b) electromagnetically coupling the test loop and the first antenna, wherein electromagnetically coupling the test loop and the first antenna comprises applying a first alternating electric current to (i) the test loop or the first antenna and to (ii) a normalizing resistor that is in series with the test loop or the first antenna;
(c) measuring a first voltage in the first antenna or in the test loop induced by the electromagnetically coupling the test loop and the first antenna, wherein measuring the first voltage comprises measuring a first resistor voltage in the normalizing resistor caused by the applying the first alternating electric current to the normalizing resistor;
(d) deploying the test loop about a second antenna in the electromagnetic measurement tool;
(e) electromagnetically coupling the test loop and the second antenna, wherein electromagnetically coupling the test loop and second first antenna comprises applying a second alternating electric current to (i) the test loop or the second antenna and (ii) the normalizing resistor that is in series with the test loop or the second antenna;
(f) measuring a second voltage in the second antenna or in the test loop induced by the electromagnetically coupling the test loop and the second antenna, wherein measuring the second voltage comprises measuring a second resistor voltage in the normalizing resistor caused by the applying the second alternating electric current to the normalizing resistor; and
(g) computing a ratio of the first voltage to the second voltage, wherein the ratio computed in (g) is a product of first, second, and third ratios, the first ratio being a ratio of the first voltage to the second voltage, the second ratio being a ratio of the second resistor voltage to the first resistor voltage, and the third ratio being a ratio of a function of a tilt angle of the first antenna and the function of a tilt angle of the second antenna.

15. The method of claim 14, wherein (a) and (d) further comprise lifting the electromagnetic measurement tool and the test loop up and away from a floor, walls, and other electrically conducting materials.

16. The method of claim 14, wherein the test loop is an axial test loop, having a moment axis coincident with an axis of the measurement tool, and the first and second antennas are tilted antennas.

17. A method of calibrating an electromagnetic measurement tool, the method comprising:
(a) deploying a test loop about a first antenna in the electromagnetic measurement tool;
(b) electromagnetically coupling the test loop and the first antenna;
(c) measuring a first voltage in the first antenna or in the test loop induced by the electromagnetically coupling the test loop and the first antenna;
(d) deploying the test loop about a second antenna in the electromagnetic measurement tool;
(e) electromagnetically coupling the test loop and the second antenna;
(f) measuring a second voltage in the second antenna or in the test loop induced by the electromagnetically coupling the test loop and the second antenna; and
(g) computing a ratio of the first voltage to the second voltage, wherein computing the ratio of the first voltage to the second voltage comprises:
processing the first voltage to compute a first tilt angle of the first antenna;
processing the second voltage to compute a second tilt angle of the second antenna; and
computing a ratio of a function of the first tilt angle to the function of the second tilt angle.

18. The method of claim 17, wherein:
the test loop is a tilted test loop;
the test loop is deployed at a plurality of azimuthal angles about the first and second antennas in (a) and (d); and
the first and second voltages comprise a corresponding plurality of first and second voltages measured at the plurality of azimuthal angles.

19. The method of claim 17, wherein:
the test loop comprises a first axial test loop and a second transverse test loop; and
the first voltage comprises first and second first voltages corresponding to the first and second test loops and the second voltage comprises first and second second voltages corresponding to the first and second test loops.

* * * * *